(12) United States Patent
Windisch

(10) Patent No.: US 9,231,170 B2
(45) Date of Patent: Jan. 5, 2016

(54) PHOSPHOR LED

(71) Applicant: OSRAM GmbH, Munich (DE)

(72) Inventor: Reiner Windisch, Pettendorf (DE)

(73) Assignee: OSRAM GmbH, Munich (DE)

( * ) Notice: Subject to any disclaimer, the term of this patent is extended or adjusted under 35 U.S.C. 154(b) by 0 days.

(21) Appl. No.: 14/450,292

(22) Filed: Aug. 4, 2014

(65) Prior Publication Data

US 2015/0034980 A1 Feb. 5, 2015

(30) Foreign Application Priority Data

Aug. 5, 2013 (DE) .......................... 10 2013 215 382

(51) Int. Cl.
*H01L 33/50* (2010.01)
*H01L 27/15* (2006.01)
*C09K 11/77* (2006.01)
*H01L 25/075* (2006.01)

(52) U.S. Cl.
CPC .......... *H01L 33/504* (2013.01); *C09K 11/7734* (2013.01); *C09K 11/7774* (2013.01); *H01L 27/15* (2013.01); *H01L 25/0753* (2013.01); *H01L 2224/48091* (2013.01)

(58) Field of Classification Search
CPC ... H01L 25/0753; H01L 27/15; H01L 33/504; H01L 2224/48091; H01L 2924/00014
USPC ....................................... 257/89, 98
See application file for complete search history.

(56) References Cited

U.S. PATENT DOCUMENTS

| 6,540,377 | B1* | 4/2003 | Ota et al. ....................... 362/231 |
| 2006/0082296 | A1 | 4/2006 | Chua et al. |
| 2010/0085728 | A1* | 4/2010 | Seto et al. ....................... 362/84 |
| 2010/0207134 | A1 | 8/2010 | Tanaka et al. |
| 2010/0308712 | A1* | 12/2010 | Liu et al. ....................... 313/503 |
| 2012/0146078 | A1 | 6/2012 | Baumann et al. |
| 2012/0286304 | A1* | 11/2012 | LeToquin et al. ... H01L 25/0753 257/89 |
| 2013/0020931 | A1* | 1/2013 | Ko et al. ....................... 313/503 |
| 2014/0035455 | A1 | 2/2014 | Galvez et al. |

FOREIGN PATENT DOCUMENTS

| DE | 102011115879 A1 | 4/2013 |
| DE | 102011085645 A1 | 5/2013 |
| WO | 2011020751 A1 | 2/2011 |
| WO | 2013006782 A1 | 1/2013 |
| WO | 2013040131 A1 | 3/2013 |
| WO | 2013053601 A2 | 4/2013 |
| WO | 2013064361 A1 | 5/2013 |

OTHER PUBLICATIONS

German Office Action issued in the parallel application 10 2013 215 382.1 on Jun. 16, 2014.

* cited by examiner

*Primary Examiner* — Duy T Nguyen

(57) ABSTRACT

A phosphor LED for emitting light emitting diode light may include an LED designed for emitting blue primary light; and an LED phosphor designed and arranged such that it is excited by the primary light during operation and emits secondary light as a consequence, said secondary light forming at least a portion of the LED light. The LED phosphor may include a green phosphor and a red phosphor. The green phosphor and the red phosphor may be provided in a ratio such that the light emitting diode light in the CIE standard chromaticity system has a color locus in the green which is spaced apart from the Planckian locus, to be precise by at least 0.01 in terms of absolute value.

14 Claims, 6 Drawing Sheets

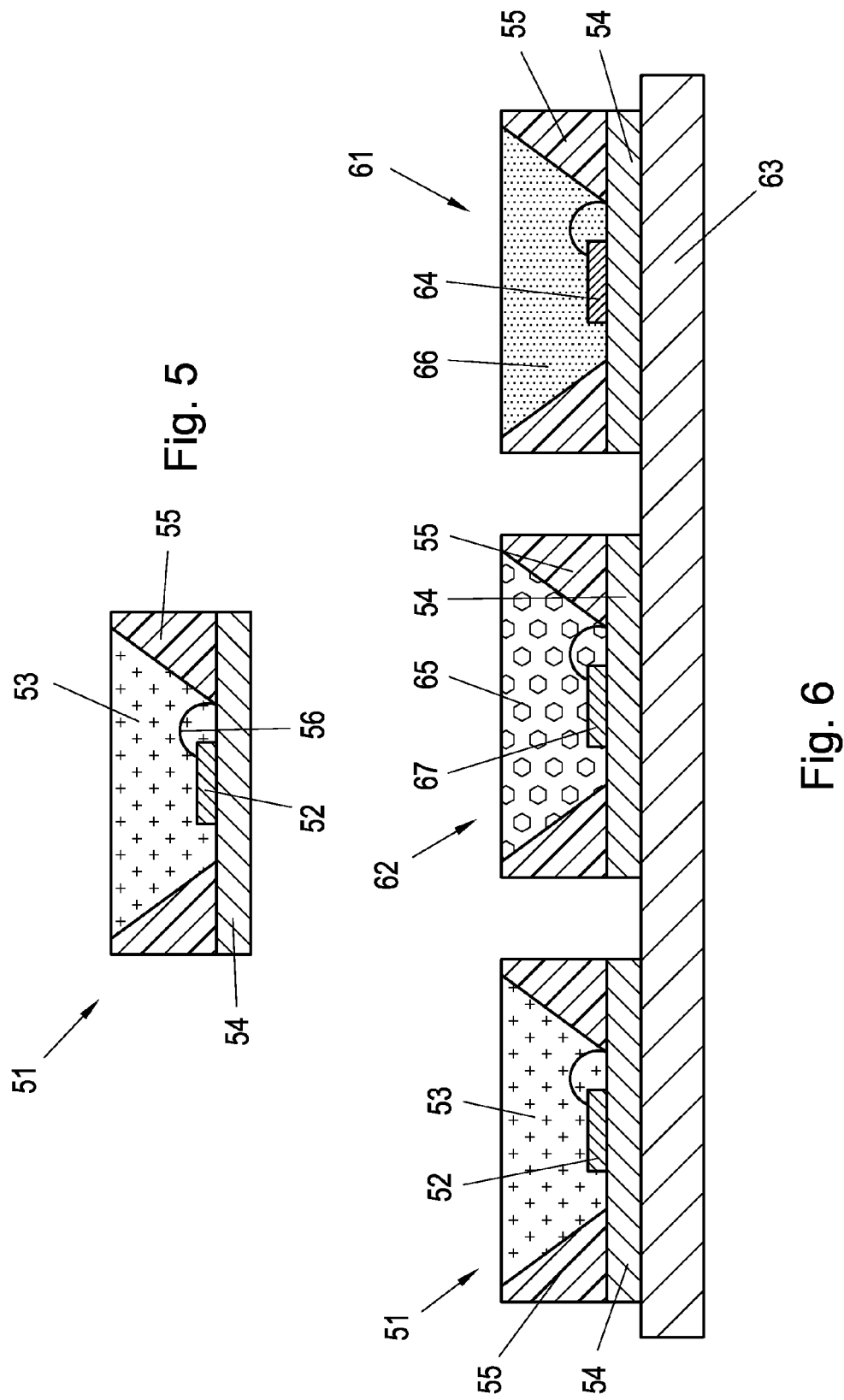

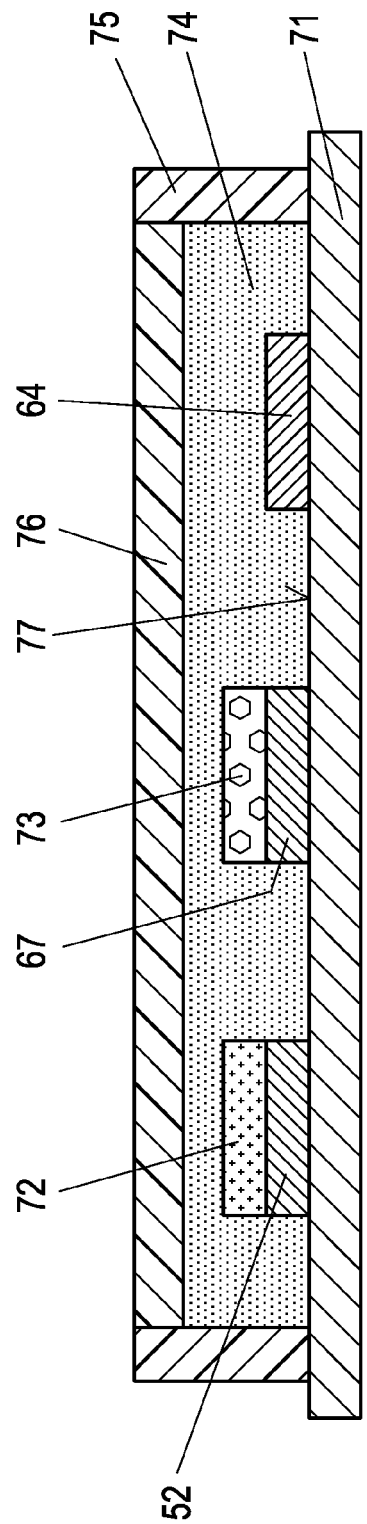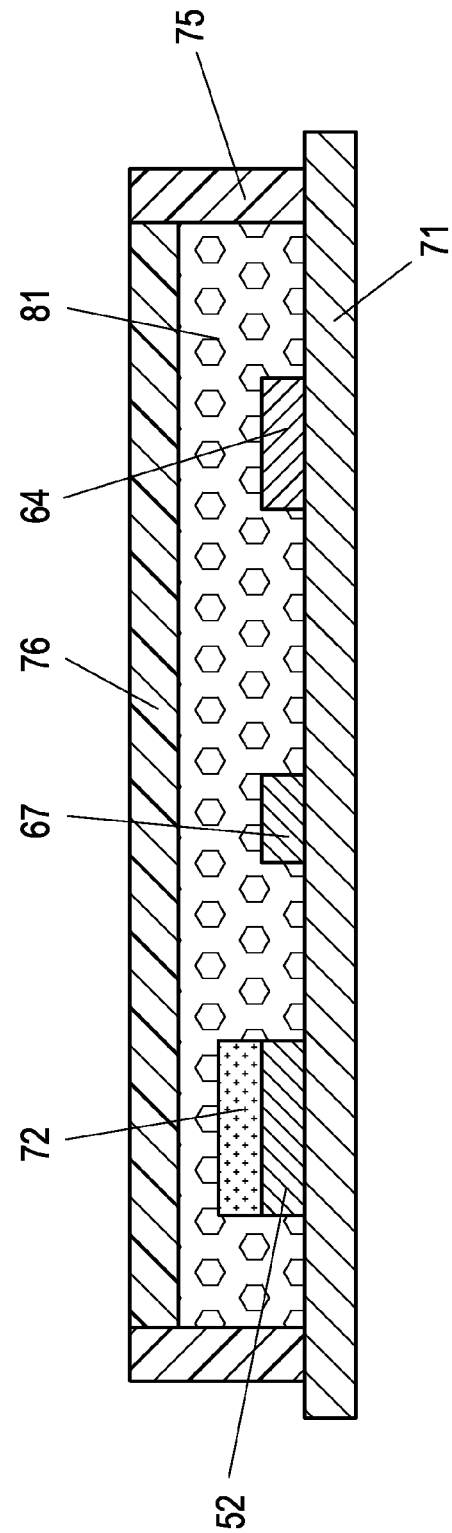

PHOSPHOR LED

CROSS-REFERENCE TO RELATED APPLICATION

This application claims priority to German Patent Application Serial No. 10 2013 215 382.1, which was filed Aug. 5, 2013, and is incorporated herein by reference in its entirety.

TECHNICAL FIELD

Various embodiments relate generally to a phosphor LED including an LED designed for emitting blue primary light.

BACKGROUND

One advantage of optoelectronic light sources (e.g. light emitting diodes, LEDs) may consist in an improved energy efficiency, for example, in comparison with conventional incandescent lamps. However, the emission spectrum of an LED may be comparatively narrowband compared with that of an incandescent lamp, which results in a poor color rendering, to be precise even in the case of light mixing. In this case, a plurality of LEDs are provided, which each emit LED light of a different color, and the mixed light resulting from the mixing of the LED light of the different colors is used.

SUMMARY

A phosphor LED for emitting light emitting diode light may include an LED designed for emitting blue primary light; and an LED phosphor designed and arranged such that it is excited by the primary light during operation and emits secondary light as a consequence, said secondary light forming at least a portion of the LED light. The LED phosphor may include a green phosphor and a red phosphor. The green phosphor and the red phosphor may be provided in a ratio such that the light emitting diode light in the CIE standard chromaticity system has a color locus in the green which is spaced apart from the Planckian locus, to be precise by at least 0.01 in terms of absolute value.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a first possibility of the arrangement of LED and phosphor element;

FIG. 6 shows a first LED module in schematic illustration;

FIG. 7 shows a second LED module in schematic illustration; and

FIG. 8 shows a third LED module in schematic illustration.

DESCRIPTION

Figure 1:
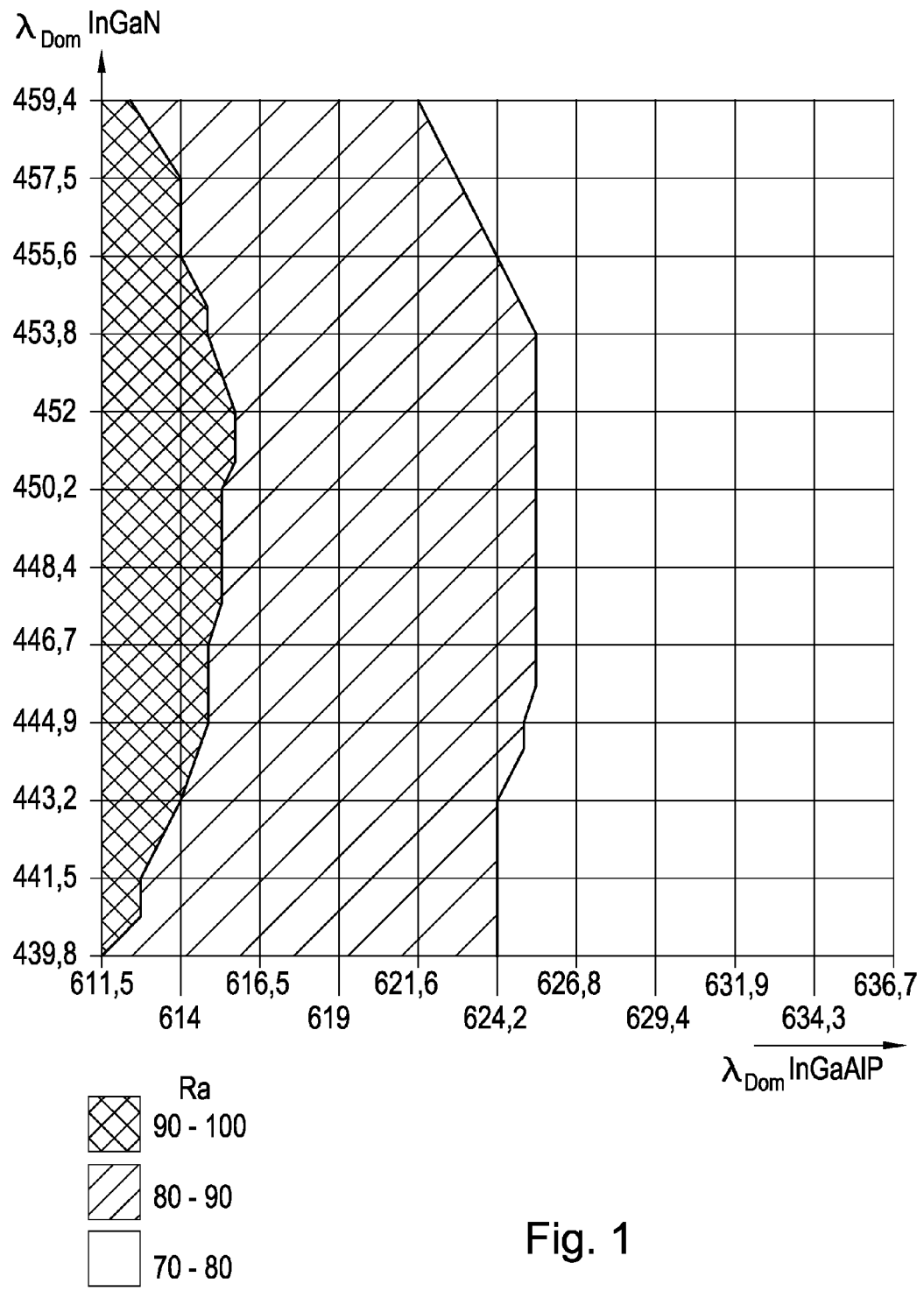
FIG. 1 shows wavelength combinations for red InGaAlP LEDs and green phosphor LEDs, namely InGaN LEDs with green phosphor (according to the prior art) for which an RA≥80 or ≥90 can be achieved.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments specify an advantageous light emitting diode (LED).

In various embodiments, a phosphor LED for emitting LED light is provided. The phosphor LED may include an LED designed for emitting blue primary light, and an LED phosphor designed and arranged such that it is excited by the primary light during operation and emits secondary light as a consequence, said secondary light forming at least a portion of the LED light, wherein the LED phosphor includes a green phosphor and a red phosphor, and wherein the green phosphor and the red phosphor are provided in a ratio such that the LED light in the CIE (CIE—Commission internationale de l'éclairage) standard chromaticity system (in the entire disclosure: CIE 1931, DIN 5033 (DIN—Deutsche Indstrienorm) has a color locus in the green which is spaced apart from the Planckian locus, to be precise by at least 0.01 in terms of absolute value, with increasing preference in this order at least 0.015, 0.02, 0.025, 0.03 or 0.035.

In other words, an LED provided for emitting green light ("green LED") is provided as the phosphor LED, that is to say as the conversion LED; in other words, the LED phosphor converts the (primary) light originally emitted with blue color by the LED. Even if the LED light could generally also by itself be secondary light, it may result from the mixing of the primary and secondary light. The spacing from the Planckian locus "in terms of absolute value" can be determined as the length of the shortest connecting line between Planckian locus and color locus; the color locus "in the green" lies above the Planckian locus.

The LED light has a color locus in the green; according to various embodiments, however, for the LED phosphor for this purpose not only a green phosphor is provided, which would suffice to make available LED light of a green color ("green LED light"), but additionally a red phosphor, which can afford the advantages explained below.

Specifically, a green LED according to various embodiments may be used, for example, as part of a white light source, that is to say can make available white light in a combined manner in, for example, a luminaire or an LED module with a red light source, e.g. a red LED, wherein a good color rendering can advantageously be achieved with a green phosphor LED according to various embodiments. As red LED, in many cases use is made here of an InGaAlP LED, the originally red light of which is utilized directly (without conversion) for the light mixing.

However, the red InGaAlP light is comparatively narrowband in terms of its spectral distribution (the fall width at half maximum around a typical emission maximum at 630 nm can be approximately 21 nm), for which reason the InGaAlP LEDs conventionally have to be presorted for use with a green LED in order to be able to achieve a good color rendering. Specifically, it is usually necessary to select those InGaAlP LEDs which have a dominant wavelength $\Lambda_{Dom}$ at relatively short wavelengths ($\Lambda_{Dom} \leq 614$ nm), so-called "short-wave" InGaAlP LEDs; otherwise, in the overall spectrum (resulting from the mixing of the LED light of the green/red LEDs), a red-green gap would arise between the green and red portions, which can significantly impair the color rendering. FIG. 1 illustrates this for a conventional combination of InGaAlP LED and green LED.

Figure 2:
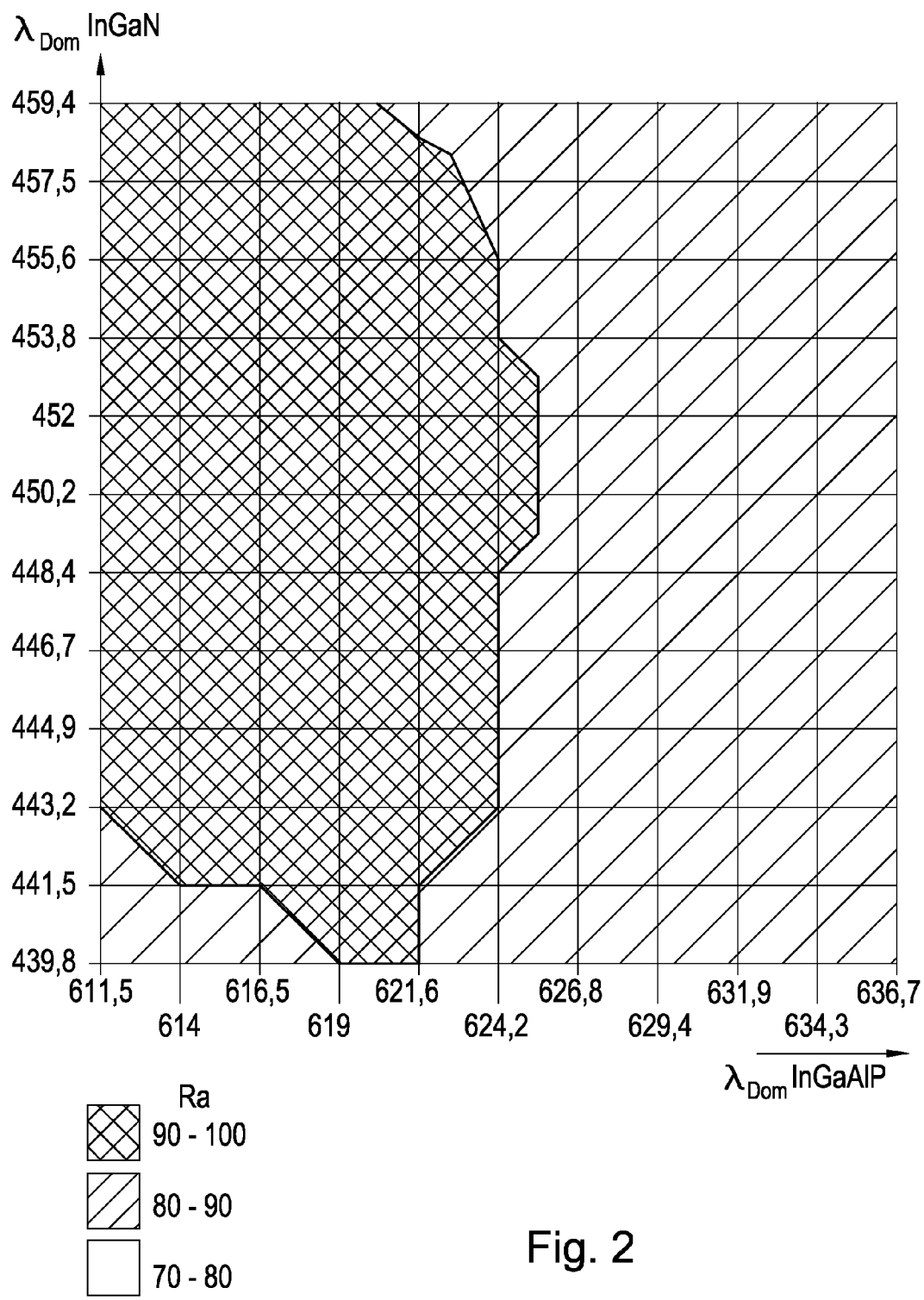
FIG. 2 shows wavelength combinations for red InGaAlP LEDs and green phosphor LEDs according to various embodiments, namely InGaN LEDs with a first LED phosphor according to various embodiments, for which RA≥90 or ≥80 can be achieved.
Figure 3:
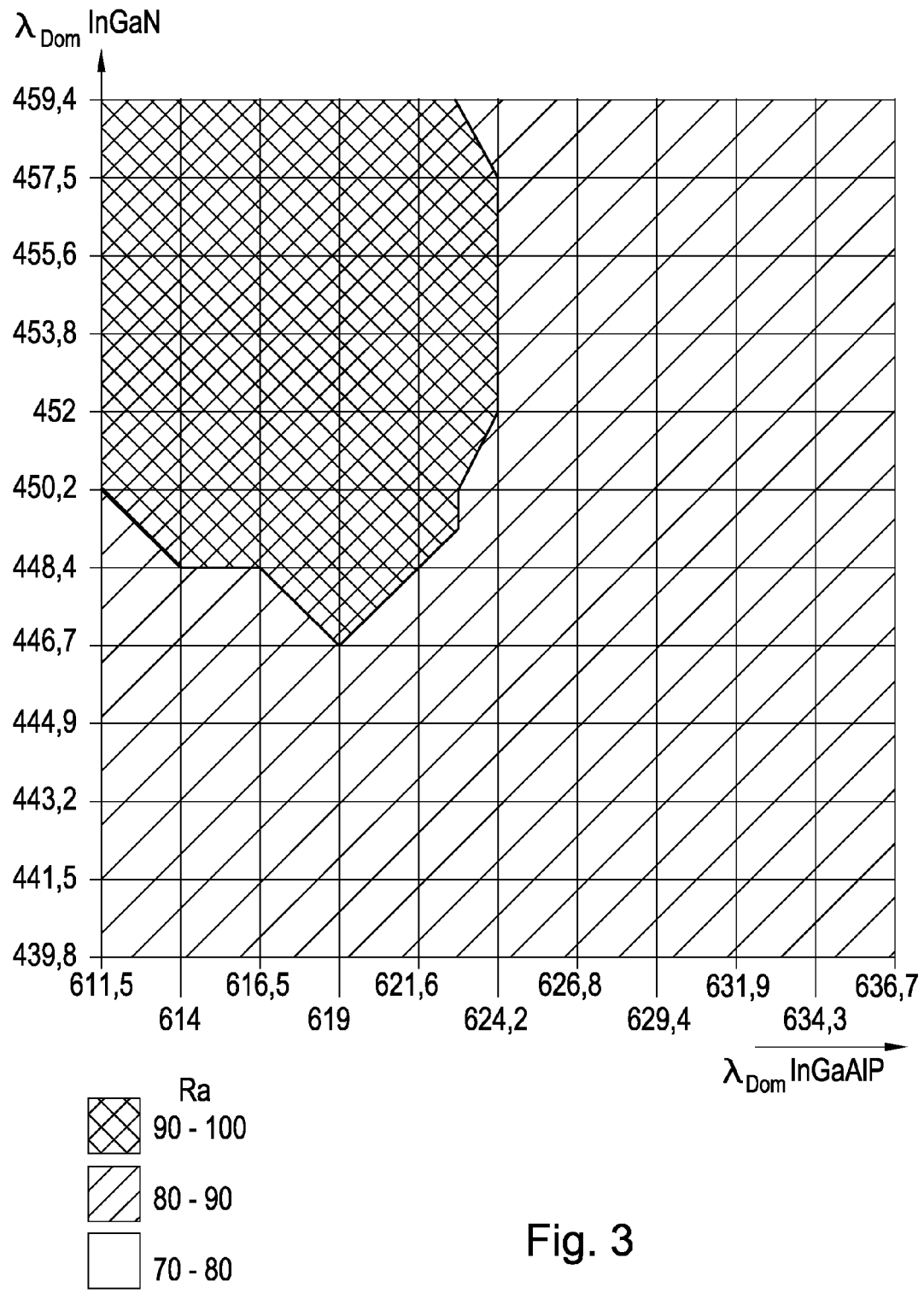
FIG. 3 shows wavelength combinations for red InGaAlP LEDs and green phosphor LEDs according to various embodiments, namely InGaN LEDs with a second LED phosphor according to various embodiments, for which RA≥90 or ≥80 can be achieved.

By virtue of the fact that now, according to various embodiments, a red phosphor is provided in addition to the green phosphor for the green LED, the red-green gap can at least be prevented from arising and it is not necessary, for example, to laboriously presort such short-wave InGaAlP LEDs as in the reference case (FIG. 1), cf. the extended wavelength range in FIG. 2 and FIG. 3. With a green LED according to various embodiments, even in combination with comparatively long-wave InGaAlP LEDs, a high color rendering index can be achieved, which may also be advantageous on account of the larger number of InGaAlP LEDs that can be utilized.

Furthermore, the inventor has discovered that, with the use of a green LED according to various embodiments, replacing a short-wave InGaAlP LED by a long-wave InGaAlP LED can also have an advantageous effect on the rendering of brown/red-brown hues, which are often perceived as unnatural in the case of short-wave InGaAlP LEDs. Owing to the lack of a corresponding test color, however, this is e.g. not manifested in the color rendering index $R_a$ according to DIN 6169 with 14 test colors.

Although these examples mentioned for illustrating the advantages of a green LED according to various embodiments refer to an InGaAlP LED, in general they are expressly not intended to restrict the subject matter to such a use. Specifically, on the one hand, any other light source can also make available a correspondingly narrowband red portion (and the combination with the green LED according to various embodiments can afford advantages); on the other hand, even in the case of an InGaAlP LED, the LED manufacturer itself need not combine the green LED therewith, rather this can, for example, also first be done by a luminaire manufacturer or even the user.

The "blue primary light" may have a dominant wavelength $\Lambda_{Dom}$ of, with increasing preference in this order, at least 434 nm, 436 nm, 438 nm, 440 nm, 442 nm or 444 nm; independently of these lower limits, for the dominant wavelength $\Lambda_{Dom}$ an upper limit of 466 nm may be provided and the following may furthermore be provided: at most 464 nm, 462 nm, 460 nm, 458 nm or 456 nm.

In various embodiments, an LED based on a III-V compound semiconductor material is provided for the phosphor LED according to various embodiments; in this case, a nitride compound semiconductor material may be provided, for instance $Al_n In_{1-n-m} Ga_m N$ where $0 \leq n \leq 1$, $0 \leq m \leq 1$ and $n+m \leq 1$; the semiconductor layer sequence may also include dopants and generally additional constituents, and only the essential constituents are indicated for the sake of simplicity. In various embodiments, an InGaN LED may be provided for the phosphor LED.

In the context of this disclosure, the term "LED" can relate generally both to a packaged LED, that is to say e.g. to an LED chip provided with an encapsulating body and an electrical contact-making element toward the macroscopic, and to an unpackaged LED, the LED chip.

The LED phosphor can, for example, be arranged on the light emission surface of the LED and/or be inserted into a part of the housing thereof, for instance embedded into a filling material, e.g. a potting material.

The provision of a phosphor LED according to various embodiments, which indeed may include a red phosphor, but the color locus of which nevertheless lies in the green and the LED light of which accordingly produces white light only when mixed with the light of a further light source, may be compared with a pure phosphor conversion for efficiency reasons, for instance. Specifically, if an InGaAlP LED, for example, is provided as a further light source, this may generally be more efficient than converting primary light to red light. Moreover, with a green phosphor LED according to various embodiments and two further light sources, of which one makes available red light and the other makes available blue light, a color-locus-controllable LED module can also be realized, that is to say that the flexibility is greater.

Insofar as reference is made to the propagation of light in the context of this disclosure, this is not intended to imply that corresponding light propagation actually has to take place in order to fulfill the subject matter; the phosphor LED and respectively a corresponding LED module and respectively a luminaire therewith are intended only to be designed for such light propagation.

Further embodiments can be found in the dependent claims and in the following description, wherein furthermore also no distinction will be made in specific detail between the representation of device, method and use aspects; the disclosure should in any case be inferred implicitly with regard to all categories.

In a configuration, the color locus of the LED light in the CIE standard chromaticity system lies above a first straight line, whose gradient m=0.59 and whose y-intercept n=0.1727, e.g. n=0.1827 (n is the y-value of the straight line at x=0). A color locus in the CIE standard chromaticity system, that is to say a pair of numbers including x- and y-values, lies "above" a corresponding straight line if the x-value of the pair of numbers, when inserted into the straight line equation, produces a value that is less than the y-value of the pair of numbers.

In various embodiments, the color locus of the LED light in the CIE standard chromaticity system lies above a second straight line having a gradient m=−0.1 and a y-intercept n=0.421, e.g. n=0.431. The position of the LED light color locus above said second straight line may be provided per se, but may be fulfilled in conjunction with the position above the first straight line (the two straight lines intersect above the Planckian locus). In the last-mentioned case, the y-value of the color locus is therefore greater than the two values that arise as a result of the x-value of the color locus being inserted into the two straight line equations.

In various embodiments, the green and red phosphors are therefore provided in a ratio such that the color locus lies at a certain spacing from the Planckian locus, e.g. above the two straight lines mentioned (e.g. having in each case the greater y-intercept). In the context of extensive ray tracing simulations, the inventor has discovered that for the addition of the red phosphor there may be an optimum range insofar as, on the one hand, the red portion in the LED light (of the green LED) should not be excessively high on account of the efficiency disadvantages mentioned in the introduction. On the other hand, however, if the color locus is too far away from the Planckian locus ("too deep in the green"), it may be necessary to supplement the green light of the phosphor LED with rather short-wave red light because otherwise a red-green gap would arise and the color rendering would become correspondingly poor (see above).

In this respect, too, in a configuration, the color locus of the LED light lies below a third straight line having a gradient m=1.71 and the y-intercept n=−0.12, e.g. n=−0.13. The color locus lies "below" if its y-value is less than the value that arises as a result of its x-value being inserted into the straight line equation.

In various embodiments, the color locus lies below a fourth straight line having the gradient m=−0.67 and the y-intercept n=0.78, e.g. n=0.77. By way of example, the color locus simultaneously lies below the third and the fourth straight line, to be precise e.g. in conjunction with the position above the first and the second straight line.

Generally, it may also be provided for a partial range to be excluded from one of the color locus ranges "in the green" specified in the context of this disclosure, to be precise a partial range around an (x/y)-value pair of (0.3938/0.4501) having a radius of e.g. 0.001, 0.003 or 0.005. The color locus ranges specified in the context of this disclosure are intended in each case also to be disclosed without such a partial range.

In a configuration, the ratio of green and red phosphors is set such that the color locus of the LED light lies in a quadrilateral spanned by four (x/y)-value pairs in the CIE standard chromaticity system. Said (x/y)-value pairs are e.g.: (0.36/0.395), (0.47/0.46), (0.38/0.52) and (0.31/0.4); value pairs which may be provided as value pairs that define such a quadrilateral may be, for instance, (0.36/0.395), (0.47/0.46), (0.425/0.49) and (0.34/0.4), for example (0.36/0.395), (0.47/0.46), (0.433/0.484) and (0.352/0.4).

In a configuration, a red phosphor having a peak wavelength $\Lambda_{peak} \leq 620$ nm, e.g. ≤619 nm, ≤618 nm, ≤617 nm or ≤616 nm, is provided as the red phosphor. One first red phosphor, explained in detail below, may have for example a peak wavelength of approximately 615 nm.

The inventor has discovered that it may be advantageous to provide a short-wave red phosphor, that is to say a red phosphor having a peak wavelength $\Lambda_{peak} \leq 614$ nm, e.g. ≤613 nm, ≤612 nm or ≤611 nm. Specifically, with such a short-wave red phosphor, an (excessively) long-wave red portion in the LED light can be avoided, which can afford an efficiency advantage: in a combination of a phosphor LED according to various embodiments with an InGaAlP LED, the latter can make available the long-wave red light portion more efficiently (without conversion losses).

On the basis of ray tracing simulations, the inventor has discovered that the efficiency of an LED module (including phosphor LED according to various embodiments and InGaAlP LED) can be increased by approximately 5% if, for the phosphor LED, a short-wave red phosphor having a peak wavelength $\Lambda_{peak} \sim 610$ nm is used instead of a red phosphor having a peak wavelength $\Lambda_{peak} \sim 615$ nm. (Possible lower limits of the peak wavelength of the red, including short-wave red, phosphor may be e.g. $\Lambda_{peak} \geq 600$ nm or $\Lambda_{peak} \geq 605$ nm.)

In a configuration, a nitridosilicate is provided as the red phosphor, specifically in a first variant a nitridosilicate of the form $M_2X_5Y_8$:Eu in which the component M consists of Sr and Ba ("first red phosphor"); in this case, the component M consists of Ba to the extent of at least 35 mol %, e.g. in this order to the extent of at least 37.5 mol %, 40 mol %, 42.5 mol % or 45 mol % (and the remainder is correspondingly Sr); the upper limit of the Ba portion (independently of the lower limit) is 75 mol %, e.g. in this order at most 70 mol %, 65 mol %, 60 mol % or 55 mol %. In various embodiments, Sr and Ba are provided to the extent of 50 mol % in each case for the component M.

Eu is provided as the doping of the first red phosphor, to be precise proportionally relative to M to the extent of at least 2 mol %, e.g. at least 2.5 mol %, 3 mol % or 3.5 mol %; independently of these lower limits, the Eu portion may be not more than 6 mol %, with further preference not more than 5 mol % or 4.5 mol %. An Eu portion of 4 mol % may be provided.

The component X includes Si; by way of example, it consists of Si; the component Y includes N; by way of example, it consists of N. In general, the Si can for example also be replaced partly by Al and/or B and/or, for the component Y, C and/or e.g. O can be present instead of N, this last for instance also in a manner governed by production.

One first red phosphor including 50 mol % Ba and an Eu portion of 4 mol % can have a peak wavelength of 615 nm, for example.

In various embodiments, likewise relating to a nitridosilicate as red phosphor, the component M consists of Sr, Ba and Ca, to be precise consists of Ba to the extent of at least 35 mol %, consists of Ba e.g. in this order to the extent of at least 37.5 mol %, 40 mol %, 42.5 mol % or 45 mol % and (independently of these lower limits) to the extent of at most 75 mol %, e.g. in this order to the extent of at most 70 mol %, 65 mol %, 60 mol % or 55 mol %; 50 mol % Ba may be provided. The Ca portion of M is at least 1 mol %, e.g. at least 1.5 mol % or 2 mol % and (independently of these lower limits) at most 5 mol %, e.g. in this order at most 4 mol %, 3.5 mol % or 3 mol %. The respective remainder after deducting the Ba and Ca portions is formed by Sr.

For the second red phosphor, particular preference is given to a Ba portion of 50 mol %, to be precise in conjunction with a Ca portion of 2.5 mol %.

In the case of the second red phosphor, too, Eu is provided as the doping, wherein a portion of at least 1 mol % (relative to M) may be provided and further 2 mol % may be provided as upper limit, e.g. 5 mol % may be provided, e.g. 4 mol % or 3 mol % may be provided. In various embodiments, the Eu portion may be 2.5 mol %. In the case of the second red phosphor, too, usually X=Si and Y=N; with regard to possible substituents, reference is made to the above explanations concerning the first red phosphor.

In various embodiments, the component M of the second red phosphor may consist of Ba to the extent of 50 mol %, may consist of Sr to the extent of 47.5 mol % and may consist of Ca to the extent of 2.5 mol % and the Eu portion may be 2.5 mol %. The second red phosphor can have a peak wavelength of approximately 610 nm, which can afford the efficiency advantages mentioned above.

In general, however, the embodiments are of course not restricted to a phosphor LED including one of the nitridosilicates explained in the previous paragraphs as the red phosphor, rather a phosphor of the form $(Sr,Ca)_1Al_1Si_1N_3$:Eu, for example, can also be provided for the short-wave red phosphor ($\Lambda_{peak} \geq 614$ nm, see above). In this case, the peak wavelength $\Lambda_{peak}$ can also become (even) more short-wave, for example can also be in a range of approximately 605 nm.

In a configuration, a long-wave green phosphor having a dominant wavelength $\Lambda_{Dom} \geq 545$ nm, e.g. $\Lambda_{Dom} \geq 550$ nm, is provided as the green phosphor. The dominant wavelength $\Lambda_{Dom}$, which is determined in the CIE standard chromaticity system as the point of intersection of the spectrum locus with the connecting line between white point and color locus, may be—for instance in the case of a garnet phosphor provided for the green phosphor—more meaningful than the peak wavelength $\Lambda_{peak}$ because garnets may exhibit a double peak. (Possible upper limits may be, for example, $\Lambda_{Dom} \leq 590$ nm, $\Lambda_{Dom} \leq 580$ nm or $\Lambda_{Dom} \leq 570$ nm.)

In this case, the values specified for the dominant wavelength of the green phosphor relate to an individual grain measurement, that is to say a measurement at a very low concentration, and may deviate at a higher concentration on account of reabsorption effects, which may be most highly pronounced at the short-wave flank. Relative to the concentrations relevant to the color locus in the green as discussed in the present case, for the green phosphor a dominant wavelength $\Lambda_{Dom} \geq 555$ nm may be provided, e.g. $\Lambda_{Dom} \geq 560$ nm.

Referring to the peak wavelength $\Lambda_{peak}$, for the green phosphor a peak wavelength $\Lambda_{peak} \geq 530$ nm may be provided, e.g. $\Lambda_{peak} \geq 535$ nm (in each case for an individual grain measurement). However, the concentration dependence of the peak wavelength is also significantly lower (therefore, only values for the individual grain measurement are specified for the red phosphor); relative to the concentrations relevant to the present color locus in the green, for the green phosphor a peak wavelength $\Lambda_{peak} \geq 535$ nm may be provided, e.g. $\Lambda_{peak} \geq 540$ nm.

Generally, a garnet of the form $A_3B_5O_{12}$:Ce may be provided for the green phosphor. The component A may include Lu; it may consist of Lu or of Lu and Y, to be precise—in the last-mentioned case—may consist of Lu to the extent of at least 70 mol %, may consist of Lu e.g. in this order to the extent of at least 72.5 mol %, 75 mol % or 77.5 mol %.

The component B may include Al; by way of example, it may consist of Al or of Al and Ga; in the last-mentioned case, B may consist of Ga to the extent of at least 5 mol %, e.g. to the extent of at least 7.5 mol % or 10 mol %, and (independently of the lower limit) may consist of Ga to the extent of at most 40 mol %, e.g. to the extent of at most 35 mol %, 30 mol % or 25 mol %.

Independently of the exact composition of the components A and B, a Ce portion of at least 1 mol % relative to A is provided, and e.g. at least 1.25 mol % or 1.5 mol %; as upper limits (independent of the lower limits), e.g. at most 3 mol %, and e.g. to at most 2.5 mol % or 2.25 mol %.

Green phosphors may be, for example, LuAG:Ce including a Ce portion of approximately 1.5 mol % or LuYAG:Ce including a Y portion of 20 mol % and a Ce portion of approximately 2 mol %.

Independently of the green phosphor specifically used, in a configuration, said green phosphor may be provided in a mixture with the red phosphor, that is to say that, within a phosphor element of the phosphor LED, for example, the two phosphors can be present in a statistically randomly distributed manner, for instance in each case in particulate form. The term "mixture" in this respect (with regard to the phosphors) therefore relates for example to a heterogeneous mixture, namely a blend, that is to say a mixture of immiscible solids. Insofar as the two phosphors can be provided in general for example also as a respective dedicated layer, in general for instance also in a remote phosphor arrangement, a mixture is preferred and the optimization of the ratio of green and red phosphors, that is to say the preferred color range (and all concretizations to that effect in the present disclosure), is intended expressly also to relate to the two phosphors in a mixture.

Insofar as green and red phosphors or "the two phosphors" are mentioned in the context of this disclosure, in general this is of course not intended to exclude the presence of a further phosphor or further phosphors, including in a mixture just mentioned. In various embodiments, however, the latter, that is to say the phosphor element of the phosphor LED, at least in terms of its phosphor portion, consists solely of the green phosphor and the red phosphor; besides the phosphor portion, the phosphor element may include a matrix material, for example, into which the phosphors are embedded.

The phosphor element can be applied to the LED for example in a layered fashion, for example by printing or else blade coating; a laminar phosphor element can also be emplaced, wherein in the phosphor lamina the phosphor portion can for example also be embedded into a matrix material, for instance into silicone. A laminar phosphor element may be provided for instance in the case of an LED module in which the individual LEDs are provided with different phosphors (not all LEDs necessarily become green phosphor LEDs according to various embodiments).

The embedding of the phosphor portion (of the phosphor element) into a matrix material may also be of interest and advantageous generally and e.g. in the case of filling, for instance potting; the matrix material is then simultaneously an encapsulating body that envelops the LED usually jointly with a base, for instance a heat sink.

Various embodiments also relate to an LED module including a phosphor LED and a second LED, the light of which in the CIE standard chromaticity system has a color locus in the red. A second LED based on a phosphide compound semiconductor material such as $Al_nIn_{1-n-m}Ga_mP$, as $0 \leq n \leq 1$, $0 \leq m \leq 1$ and $n+m \leq 1$, may be provided. With regard to the advantages of a combination including phosphor LED according to various embodiments and InGaAlP LED, reference is made to the explanations above.

In various embodiments, the LED module may include a third LED, the light of which in the CIE standard chromaticity system has a color locus in the blue. Here, in each case within an interval of, e.g. in this order, (+/−0.2), (+/−0.1) or (+/−0.05), "in the red" means a color value in the CIE standard chromaticity system around an x-value of 0.65 and a y-value of 0.33; the color locus "in the blue" can be a "traditional" blue hue in a corresponding interval around an x-value of 0.15 and a y-value of 0.06; however, bluish white in a corresponding interval around an x-value of 0.22 and a y-value of 0.25 can also be provided as the blue hue.

With the combination of (green) phosphor LED according to various embodiments, second (red) and third (blue) LED, a color-locus-controllable LED module can be realized; the color locus can be set along the Planckian locus, for example, such that white light of different color temperatures is obtained depending on the setting. It is therefore possible, by means of the energization, optionally to set e.g. warm-white light (color temperature <3300 K); neutral-white light (color temperature of 3300 K to 5300 K) and daylight-white light (color temperature >5300 K) (various embodiments are also directed, for example, to such a use).

It goes without saying here that it is not necessarily the case that only a single green LED according to various embodiments, second or third LED is respectively provided in an LED module.

The term "LED module" relates generally to LEDs which in any case are provided on a common substrate body (e.g. on a common arrangement surface of the substrate body), for example are connected thereto in a planar fashion, e.g. by soldering or adhesive bonding. In this case, on the one hand, the LEDs can also already each be packaged per se; on the other hand, the LEDs can also be unpackaged per se and can be jointly packaged, for example only in the course of production of the LED module, that is to say can for example be placed onto a common carrier board, be electrically connected and/or be provided in particular with an encapsulating body that at least partly overlaps the LEDs, e.g. by filling, e.g. by potting with silicone material.

The "filling" can also be effected by printing or spraying, for example, e.g. filling may be effected by molding (with pressure or without pressure). The LEDs may be covered by an integral (monolithic) encapsulating material, which may touch the emission surfaces and, if appropriate, also (regions of the) side surfaces of the LEDs.

In an LED module according to various embodiments, a region of the arrangement surface between at least two of the LEDs, e.g. between all of the LEDs, is provided as a region of "high reflectivity"; the region can therefore have a reflectivity of, e.g. in this order, at least 50%, 60%, 70%, 80%, 85% or 90% (relative to the visible range of the spectrum).

A corresponding reflectivity can be set, for example, by an Ag and/or Al mirror applied to the arrangement surface or forming the latter. Furthermore, for example, a matrix material with embedded particles provided between the LEDs can also cause the reflectivity, for instance a silicone material, for example with embedded titanium dioxide particles. The matrix material or generally a coating of the arrangement surface that provides the reflectivity is intended to project beyond the semiconductor material of the LEDs e.g. by not more than 25%, 15% or 5% (relative to the height—taken in the main propagation direction—of the LED having the smallest height); by way of example, it does not project beyond the LEDs at all.

Various embodiments also relate to an LED phosphor designed for a phosphor LED, and all features disclosed above with reference to the phosphor LED are intended also to be disclosed in a manner relating to the LED phosphor, to be precise e.g. also relating to the use thereof for a phosphor LED (described above).

Furthermore, various embodiments also relate to the use of a phosphor LED according to various embodiments together with a second LED, the light of which in the CIE standard chromaticity system has a color locus in the red, for generating white mixed light having a color rendering index of at least 85, e.g. in this order of at least 86, 87, 88 or 89. With regard to the color locus in the red and the preferred configuration of the LED, reference is made to the disclosure above; the color locus "in the white" is intended to be spaced apart from the Planckian locus preferably by not more than 0.005, e.g. not more than 0.004, 0.003, 0.002 or 0.001, in terms of absolute value.

FIG. 1 illustrates for a conventional LED phosphor, that is to say for a green phosphor without a red phosphor, what color rendering index $R_a$ can be achieved depending on the dominant wavelengths $\Lambda_{Dom}$ of the LEDs, to be precise in the case of a color-locus-controllable LED module. In this case, the illustration relates respectively to the $R_a$ which can at least be achieved within a color locus range of between 2700 K and 4000 K (to the smallest $R_a$ value within the color locus range).

On the y-axis (vertical) here there is plotted the dominant wavelength $\Lambda_{Dom}$ of the InGaN LED whose primary light is not utilized directly, but rather is converted by the green phosphor (without a red phosphor in the case of FIG. 1) to secondary light and in a mixture with the primary light forms LED light. On the x-axis (horizontal) there is plotted the dominant wavelength $\Lambda_{Dom}$ of the InGaAlP LED whose red light is utilized directly without conversion, to be precise for mixing with the green LED light and with bluish white light, thus resulting in white light as the result. For the bluish white light, an InGaN LED with a green LuAGaG phosphor is provided; also cf. the description below concerning FIG. 6, for example.

It is evident from FIG. 1 that a high $R_a \geq 90$ can be achieved only with comparatively short-wave InGaAlP LEDs; the dominant wavelength $\Lambda_{Dom}$ should be $\leq 614$ nm (the cross-hatched region on the left in FIG. 1 corresponds to an $R_a \geq 90$). Therefore, for example, it may be provided to presort correspondingly short-wave InGaAlP LEDs, which can increase the manufacturing complexity and thus also the costs.

If long-wave InGaAlP LEDs are used, by contrast, the $R_a$ increasingly deteriorates, to be precise on account of an increasing spacing (red-green gap) between the comparatively narrowband emission of the InGaAlP LEDs and the spectrum of the green LED light. In this regard, by way of example, at a dominant wavelength $\Lambda_{Dom}$ of the InGaAlP LEDs around 619 nm, the $R_a$ is already less than 90 and it falls to below 80 at a dominant wavelength around 627 nm. On account of the increasing blue-green gap, an increasing range is absent in the spectrum of the white light, which increasingly impairs the color rendering.

FIG. 2 illustrates analogously to FIG. 1 the achievable $R_a$ depending on the dominant wavelengths $\Lambda_{Dom}$, to be precise once again of an InGaAlP LED and an InGaN LED that makes available blue primary light. In this case, however, for converting the blue primary light, an LED phosphor according to various embodiments is provided, that is to say a mixture of a green phosphor and a red phosphor; the LED light that arises as a result of the mixing of the secondary light with the primary light has a color locus in the green (cf. FIG. 4).

The red phosphor supplements the spectrum of the white light, that is to say closes e.g. the gap that arises otherwise (without red phosphor) between the narrowband emission of the InGaAlP LEDs and the green LED light.

As a result, an $R_a \geq 90$ can be achieved over a larger range of the InGaAlP wavelengths and the $R_a$ is above 80 in the entire range (the diagrams in FIG. 1, FIG. 2 and FIG. 3 show the same scaling). By way of example, even comparatively long-wave InGaAlP LEDs can be used, which helps to reduce the sorting complexity and is also advantageous insofar as short-wave InGaAlP LEDs can bring about a rendering of brown/red-brown hues that is perceived as unnatural.

The data on which the diagrams according to FIG. 1 and FIG. 2 (and also FIG. 3 and FIG. 4) are based were determined by the inventor in intensive ray tracing simulations. In the case of FIG. 1 (conventional) a YAGaG including a Ga portion of approximately 25 mol % and a Ce portion of approximately 4 mol % was assumed here as the green phosphor.

In the case of the first embodiment in accordance with FIG. 2, LuAG including a Ce portion of approximately 1.5 mol % (relative to component A, cf. the introductory part of the description) is provided as the green phosphor. The green phosphor is mixed with a red phosphor, to be precise with a nitridosilicate $(Sr,Ba,Ca)_2Si_5N_8$:Eu, wherein the Ba portion in the component M (cf. the introductory part of the description) is 50 mol % and the Ca portion in the component M is 2.5 mol %. The Eu portion is 2.5 mol % (relative to M).

Figure 4:
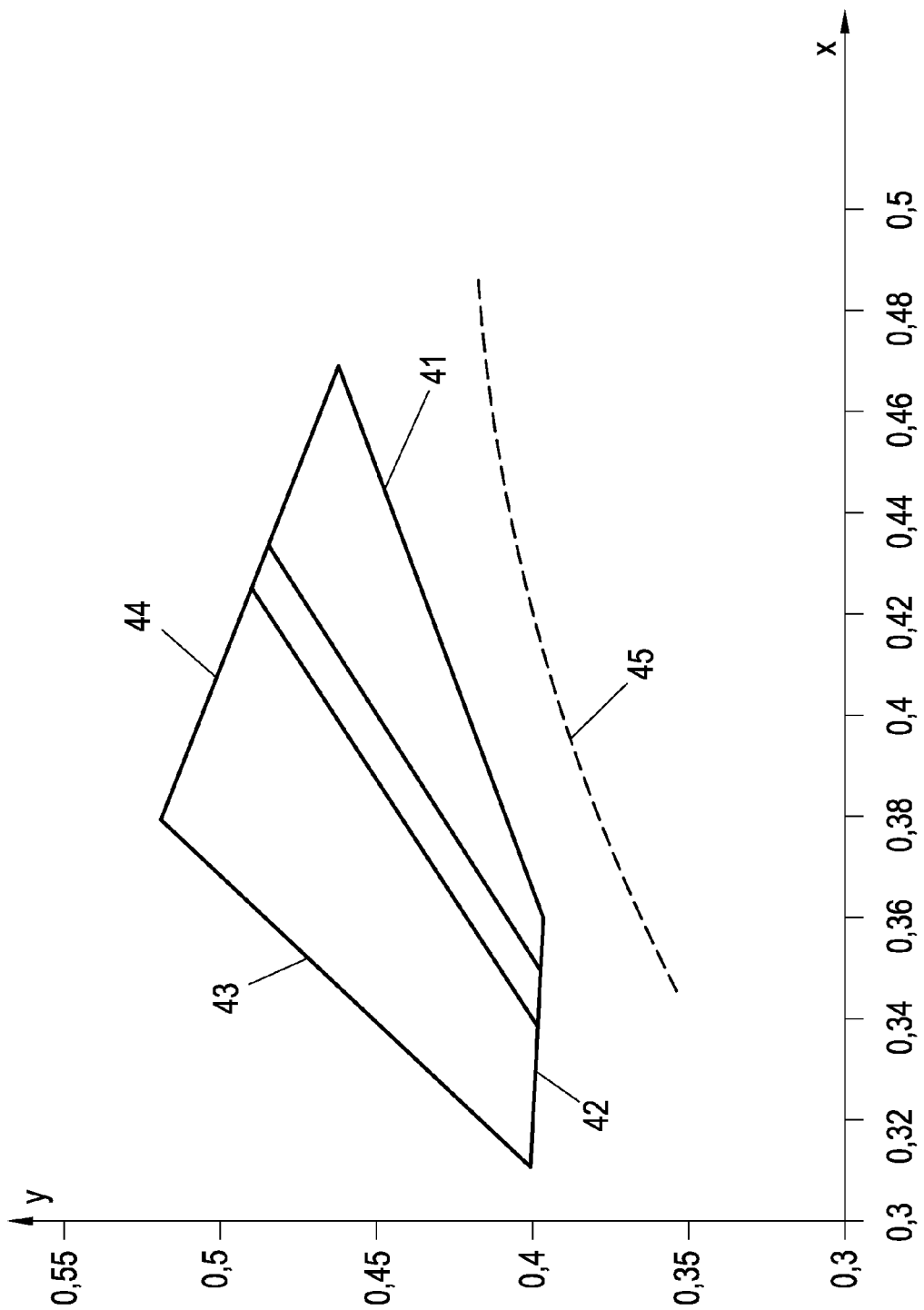
FIG. 4 shows in a CIE standard chromaticity system a color locus in the green which may be provided for the LED light of a phosphor LED according to various embodiments.

In this case, the green phosphor and the red phosphor are provided in a ratio such that the color locus of the secondary light lies in the green, cf. FIG. 4.

The embodiment on which FIG. 3 is based differs from that in accordance with FIG. 2 in terms of the green phosphor provided for the phosphor mixture; an LuYAG:Ce including a Y portion of 20 mol % in the component A (cf. the introductory part of the description) and a Ce portion of approximately 2 mol % (relative to A) is provided. In this case, too, an $R_a \geq 90$ can still be achieved with comparatively long-wave InGaAlP LEDs, in any case provided that the dominant wavelength $\Lambda_{Dom}$ of the InGaN LEDs $\geq 450$ nm. However, an $R_a \geq 80$ can be achieved with all combinations, that is to say without laborious presorting of the InGaAlP LEDs.

FIG. 4 shows, in an excerpt from a CIE standard chromaticity system, the color locus range in the green containing the color locus of the LED light of the phosphor LED according to various embodiments. In the simulations on which the figure is based, in each case a plurality of color loci were investigated here for the phosphor combinations (of green and red phosphors) explained with reference to FIG. 2 and FIG. 3, which color loci were set via the respective ratio of green and red phosphors.

For both phosphor combinations, for color loci (of the phosphor LED) lying within the quadrilateral, in conjunction with an InGaAlP LED having the dominant wavelength $\Lambda_{Dom}=615$ nm, it is then possible to achieve an $R_a \geq 80$ or even $\geq 90$ (on the Planckian locus), wherein in each case three InGaN dominant wavelengths $\Lambda_{Dom}$ of 445 nm, 450 nm and 455 nm were investigated.

A quadrilateral enclosing the individual color loci of the different phosphor mixtures that were determined by means of ray tracing simulations is depicted in FIG. 4. The sides of said quadrilateral are formed by four straight lines, namely firstly a first straight line 41 having a gradient m=0.59 and a y-intercept n=0.1827 and a second straight line 42 having m=−0.1 and n=0.43. For the LED phosphor of a phosphor LED according to various embodiments, the mixing ratio of green and red phosphors is set such that the color locus lies above these two straight lines (in this regard, the respectively "higher" straight line is crucial). The two upper sides of the quadrilateral in the figure are formed by a third straight line 43 having m=1.71 and n=−0.13 and a fourth straight line having m=−0.67 and n=0.77, and the mixing ratio of green and red phosphors is chosen such that the color locus lies below the third straight line 43 and fourth straight line 44.

The reference sign 45 identifies the Planckian locus. The corner points of the largest quadrilateral, expressed in (x/y)-value pairs, lie at: (0.36/0.395), (0.47/0.46), (0.38/0.52) and (0.31/0.4).

The further provided, smaller (likewise depicted) quadrilaterals result from the (x/y)-value pairs (0.36/0.395), (0.47/0.46), (0.425/0.49) and (0.34/0.4) and (0.36/0.395), (0.47/0.46), (0.433/0.484) and (0.352/0.4). The boundary on the left in the figure (corresponding to the third straight line 43) moves closer to the Planckian locus 45.

FIG. 5 shows a phosphor LED 51 according to various embodiments, namely an InGaN LED 52, whose blue primary light ($\Lambda_{Dom} \sim 450$ nm) is converted by a phosphor element to green secondary light (having a red portion). In this case, the phosphor element is a silicone potting 53, into which the phosphor particles of the green and red phosphors are embedded in a statistically distributed fashion as matrix material (not illustrated in specific detail).

The InGaN LED 52 is adhesively bonded onto a substrate body 54 composed of copper with an injection-molded plastic enclosure 55 (pre-molded lead frame); the plastic enclosure delimits an upwardly open cavity that is filled with the silicone potting 53 after contact has been made with the InGaN LED 52 by means of a bonding wire 56.

FIG. 6 shows a first LED module, namely a phosphor LED 51 explained with reference to FIG. 5, said phosphor LED being soldered together with a second LED 61 and a third LED 62 on a common substrate 63. The second LED 61 is a packaged InGaAlP LED, whose light having a red hue is utilized directly without further conversion. For the third LED 62, which is designed for emitting light having a blue hue, a packaged InGaN LED 67 is provided; the latter is enveloped by a potting material 65, into which green phosphor is embedded as matrix material. Specifically, in the case of the second LED 62, the blue primary light of the InGaN LED 67 is converted partly to green, which results in a bluish white color locus (cf. the introductory part of the description).

For the InGaAlP LED, too, a potting material 66 (silicone) is provided; however, no phosphor is embedded into said material ("clear potting").

Disposed downstream of the LEDs 51, 61, 62 provision may be made of, for example, an optical unit (not illustrated), for example a microlens array and/or a diffusing plate, such that the green light (with red portion) is intermixed with the red and the bluish white light and white light arises owing to the light mixing.

With the three colors (green, red and bluish white) of the LEDs 51, 61 and 62, a color-locus-controllable LED module can be realized; the desired color locus can be set, for example, by means of the respective operating currents or, in the case of pulse width modulation, the respective duty cycle.

FIG. 7 shows a further LED module, to be precise LEDs that are unpackaged per se and are mounted on a common substrate body 71, namely once again an InGaN LED 52 for green, an InGaN LED 67 for bluish white and an InGaAlP LED 64 for red.

In this case, the green LED phosphor 72 according to various embodiments and the bluish white phosphor 72 are provided as phosphor laminae applied to the respective InGaN LED 52, 67. The LEDs 52, 64, 67 are enveloped with a common encapsulating body, namely with a clear silicone potting 74. During production, prior to potting, a dam 75 extending around the LEDs 52, 64, 67 is applied to the substrate body 71 and laterally delimits an upwardly open cavity that is then filled with the silicone potting 74. A further layer 76 with scattering particles embedded therein is provided on the clear silicone potting 74 in order to intermix the green, red and blue light. The surface 77 of the substrate body 1 situated opposite the scattering layer 76 is highly reflective in order to reduce losses as a result of back-reflection.

FIG. 8 shows a further LED module which, like that in accordance with FIG. 7, is constructed from LEDs 52, 64, 67 that are unpackaged per se. The green LED phosphor 72 according to various embodiments is once again applied to the InGaN LED 52 as a phosphor lamina. In contrast to the embodiment in accordance with FIG. 7, however, the bluish white phosphor is not applied to the InGaN LED 67 in the form of a lamina, rather the correspondingly green phosphor particles are embedded into the silicone potting 81 as matrix material.

This may be advantageous insofar as an InGaN LED 67 of smaller size is provided for the blue light in the case of the LED module in accordance with FIG. 8; specifically, overall a comparatively small proportion of blue light is required and a plurality of small InGaN LEDs 67 instead of one/a few large InGaN LED(s) 67 can afford advantages for example with regard to the arrangement possibilities. In this case, the bluish white phosphor then need not be applied respectively individually to the smaller InGaN LEDs 67, which would be complicated.

For the rest, the LED module in accordance with FIG. 8 corresponds to that in accordance with FIG. 7, that is to say that a dam 75 is also applied to the substrate body 71 and filled with the silicone potting 81 (with green phosphor therein); a scattering layer 76 is once again provided opposite the highly reflective surface 77 of the substrate body. Generally, the same reference signs designate parts having the same function.

In various embodiments, a phosphor light emitting diode as described above may be used together with a second light emitting diode, the light of which in the CIE standard chromaticity system has a color locus in the red, for generating mixed light having a color locus in the white and a color rendering index of at least 85.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A phosphor light emitting diode for emitting light emitting diode light comprising:
   a light emitting diode designed for emitting blue primary light; and
   a light emitting diode phosphor designed and arranged such that it is excited by the primary light during operation and emits secondary light as a consequence, said secondary light forming at least a portion of the light emitting diode light;
   wherein the light emitting diode phosphor comprises a green phosphor and a red phosphor; and
   wherein the green phosphor and the red phosphor are provided in a ratio such that the light emitting diode light in the Commission Internationale l'Eclairage "CIE" standard chromaticity system has a color locus in the green which is spaced apart from the Planckian locus, to be precise by at least 0.01 in terms of absolute value;
   wherein the color locus of the light emitting diode light in the CIE standard chromaticity system lies in a quadrilateral spanned by four (x/y)-value pairs, which (x/y)-value pairs are: (0.36/0.395), (0.47/0.46), (0.38/0.52) and (0.31/0.4).

2. The phosphor light emitting diode of claim 1,
   wherein a red phosphor having a peak wavelength $\Lambda_{peak} \leq 620$ nm is provided as the red phosphor.

3. The phosphor light emitting diode of claim 2,
   wherein a short-wave red phosphor having a peak wavelength $\Lambda_{peak} \leq 614$ nm is provided as the red phosphor.

4. The phosphor light emitting diode of claim 1,
   wherein a nitridosilicate is provided as the red phosphor.

5. The phosphor light emitting diode of claim 1,
   wherein a nitridosilicate $M_2X_5Y_8$:Eu is provided as the red phosphor, in which the component M consists of Sr and Ba, to be precise consists of Ba to the extent of at least 35 mol % and to the extent of at most 75 mol %, and in which furthermore the component X comprises Si and the component Y comprises N.

6. The phosphor light emitting diode of claim 3,
   wherein a nitridosilicate $M_2X_5Y_8$:Eu is provided as the red phosphor, in which the component M consists of Sr, Ba and Ca, to be precise consists of Ba to the extent of at least 35 mol % and to the extent of at most 75 mol % and consists of Ca to the extent of at least 1 mol % and to the extent of at most 5 mol %, and in which furthermore the component X comprises Si and the component Y comprises N.

7. The phosphor light emitting diode of claim 1,
   wherein a long-wave green phosphor having a dominant wavelength $\Lambda_{Dom} \geq 545$ nm is provided as the green phosphor.

8. The phosphor light emitting diode of claim 1,
   wherein a long-wave green phosphor having a dominant wavelength $\Lambda_{Dom} \geq 550$ nm is provided as the green phosphor.

9. The phosphor light emitting diode of claim 1,
   wherein the green phosphor is a garnet $A_3B_5O_{12}$:Ce, in which the component A consists of Lu or consists of Lu and Y, to be precise—in the last-mentioned case—consists of Lu to the extent of at least 70 mol %, and in which the component B comprises Al.

10. The phosphor light emitting diode of claim 1,
    wherein the green phosphor is a garnet $A_3B_5O_{12}$:Ce, in which the component A comprises Lu and in which the component B consists of Al or consists of Al and Ga, to be precise—in the last-mentioned case—consists of Ga to the extent of at most 40 mol %.

11. The phosphor light emitting diode of claim 1,
    wherein the green phosphor and the red phosphor are provided in a mixture.

12. A light emitting diode module, comprising:
    a phosphor light emitting diode, comprising:
       a light emitting diode designed for emitting blue primary light; and
       a light emitting diode phosphor designed and arranged such that it is excited by the primary light during operation and emits secondary light as a consequence, said secondary light forming at least a portion of the light emitting diode light;
       wherein the light emitting diode phosphor comprises a green phosphor and a red phosphor; and
       wherein the green phosphor and the red phosphor are provided in a ratio such that the light emitting diode light in the Commission Internationale l'Eclairage "CIE" standard chromaticity system has a color locus in the green which is spaced apart from the Planckian locus, to be precise by at least 0.01 in terms of absolute value;
       wherein the color locus of the light emitting diode light in the CIE standard chromaticity system lies in a quadrilateral spanned by four (x/y)-value pairs, which (x/y)-value pairs are: (0.36/0.395), (0.47/0.46), (0.38/0.52) and (0.31/0.4);
    wherein in addition to the phosphor light emitting diode a second light emitting diode is provided, the light of which in the CIE standard chromaticity system has a color locus in the red.

13. The light emitting diode module of claim 12,
    wherein the second light emitting diode, the light of which in the CIE standard chromaticity system has a color locus in the red,
    wherein the second light emitting diode is an InGaAlP light emitting diode.

14. The light emitting diode module of claim 13, further comprising:
    a third light emitting diode, the light of which in the CIE standard chromaticity system has a color locus in the blue.

* * * * *